United States Patent
Balakrishnan et al.

(10) Patent No.: US 9,373,624 B1
(45) Date of Patent: Jun. 21, 2016

(54) FINFET DEVICES INCLUDING EPITAXIALLY GROWN DEVICE ISOLATION REGIONS, AND A METHOD OF MANUFACTURING SAME

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/737,146

(22) Filed: Jun. 11, 2015

(51) Int. Cl.
| | |
|---|---|
| H01L 27/00 | (2006.01) |
| H01L 29/00 | (2006.01) |
| H01L 27/092 | (2006.01) |
| H01L 29/06 | (2006.01) |
| H01L 21/8238 | (2006.01) |
| H01L 21/761 | (2006.01) |

(52) U.S. Cl.
CPC .......... *H01L 27/0924* (2013.01); *H01L 21/761* (2013.01); *H01L 21/823821* (2013.01); *H01L 21/823828* (2013.01); *H01L 21/823871* (2013.01); *H01L 21/823878* (2013.01); *H01L 29/0646* (2013.01)

(58) Field of Classification Search
CPC ............... H01L 21/823821; H01L 21/823828; H01L 21/761; H01L 21/823871; H01L 21/823878; H01L 27/0924; H01L 27/092; H01L 27/228; H01L 29/0646; H01L 29/785; H01L 29/7848
See application file for complete search history.

(56) References Cited

U.S. PATENT DOCUMENTS

| | | | |
|---|---|---|---|
| 8,278,175 B2 | 10/2012 | Cheng et al. | |
| 8,450,806 B2 | 5/2013 | Furukawa et al. | |
| 8,486,776 B2 | 7/2013 | Bedell et al. | |
| 8,652,891 B1* | 2/2014 | Yin ................. | H01L 21/823431 257/E21.454 |
| 8,729,607 B2* | 5/2014 | Itokawa .............. | H01L 29/7853 257/213 |
| 8,900,973 B2 | 12/2014 | Berliner et al. | |
| 8,941,153 B2* | 1/2015 | Lee ................. | H01L 21/823431 257/288 |
| 2011/0121406 A1* | 5/2011 | Lee ................. | H01L 21/823431 257/401 |
| 2011/0227165 A1 | 9/2011 | Basker et al. | |
| 2014/0008729 A1 | 1/2014 | Bedell et al. | |
| 2014/0048888 A1 | 2/2014 | Chen et al. | |

FOREIGN PATENT DOCUMENTS

CN      104009086 A     8/2014

\* cited by examiner

*Primary Examiner* — Nikolay Yushin
(74) *Attorney, Agent, or Firm* — Louis J. Percello; Ryan, Mason & Lewis, LLP (57) ABSTRACT

A method for manufacturing a semiconductor device including a plurality of fin field-effect transistor (FinFET) devices, comprises forming a plurality of fins on a substrate, wherein a first portion of the fins corresponds to p-type field-effect transistors, and a second portion of the fins corresponds to n-type field-effect transistors, forming a plurality of gate electrodes on the plurality of the fins, growing a p-type doped epitaxial region at each of a plurality of source/drain regions between predetermined gate electrodes of the p-type field-effect transistors, and growing an n-type doped epitaxial region at one or more areas between gate electrodes of respective adjacent p-type field-effect transistors to create one or more p-n junctions electrically isolating the adjacent p-type field-effect transistors from each other.

20 Claims, 9 Drawing Sheets

*FIG. 10*

FINFET DEVICES INCLUDING EPITAXIALLY GROWN DEVICE ISOLATION REGIONS, AND A METHOD OF MANUFACTURING SAME

TECHNICAL FIELD

The field generally relates to fin field-effect transistor (FinFET) devices and methods of manufacturing same and, in particular, to FinFET devices including epitaxially grown device isolation regions, and a method of manufacturing same.

BACKGROUND

In technologies using FinFETs, uniaxial strain on the fins provides benefits, and can contribute significantly to device performance. For example, p-type FETs (PFETs) benefit from compressive strain, and n-type FETs (NFETs) benefit from tensile strain. During a fabrication process of a FinFET device, the fins may be cut during patterning in order to electrically isolate source/drain regions of adjacent transistors from each other. Cutting of the fins relaxes the compressive strain near the location where the fin is cut, thereby degrading performance, especially with respect to p-type FETs (PFETs), which benefit from compressive strain.

Accordingly there is a need for FinFET devices and a method of forming same that maintain uniaxial strain along areas of the fins where transistors are formed.

SUMMARY

In general, exemplary embodiments of the invention include fin field-effect transistor (FinFET) devices and methods of manufacturing same and, in particular, FinFET devices including epitaxially grown device isolation regions, and a method of manufacturing same.

According to an exemplary embodiment of the present invention, a method for manufacturing a semiconductor device including a plurality of fin field-effect transistor (FinFET) devices, comprises forming a plurality of fins on a substrate, wherein a first portion of the fins corresponds to p-type field-effect transistors, and a second portion of the fins corresponds to n-type field-effect transistors, forming a plurality of gate electrodes on the plurality of the fins, growing a p-type doped epitaxial region at each of a plurality of source/drain regions between predetermined gate electrodes of the p-type field-effect transistors, and growing an n-type doped epitaxial region at one or more areas between gate electrodes of respective adjacent p-type field-effect transistors to create one or more p-n junctions electrically isolating the adjacent p-type field-effect transistors from each other.

According to an exemplary embodiment of the present invention, a method for manufacturing a semiconductor device including a plurality of fin field-effect transistor (FinFET) devices, comprises forming a plurality of fins on a substrate, wherein at least a portion of the fins corresponds to first field-effect transistors having a first type of doping, forming a plurality of gate electrodes on the plurality of the fins, growing an epitaxial region having the first type of doping at each of a plurality of source/drain regions between predetermined gate electrodes of the first field-effect transistors, and growing an epitaxial region having a second type of doping at one or more areas between gate electrodes of respective adjacent first field-effect transistors to create one or more junctions electrically isolating the adjacent first field-effect transistors from each other.

According to an exemplary embodiment of the present invention, a fin field-effect transistor (FinFET) device, comprises a plurality of fins on a substrate, wherein a first portion of the fins corresponds to p-type field-effect transistors, and a second portion of the fins corresponds to n-type field-effect transistors, a plurality of gate electrodes on the plurality of the fins, a p-type doped epitaxial region at each of a plurality of source/drain regions between gate electrodes of the p-type field-effect transistors, and an n-type doped epitaxial region at one or more areas between gate electrodes of respective adjacent p-type field-effect transistors creating one or more p-n junctions electrically isolating the adjacent p-type field-effect transistors from each other.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION OF EXEMPLARY EMBODIMENTS

Exemplary embodiments of the invention will now be discussed in further detail with regard to fin field-effect transistor (FinFET) devices and methods of manufacturing same and, in particular, to FinFET devices including epitaxially grown device isolation regions. This invention may, however, be embodied in many different forms and should not be construed as limited to the embodiments set forth herein.

The embodiments of the present invention include FinFET devices and methods of manufacturing same which utilize a device isolation scheme in which fins are not cut. In accordance with an embodiment of the present invention, instead of cutting fins between adjacent transistors, source/drain epitaxy of the opposite polarity is performed. More specifically, a region having opposite polarity to that of the adjacent transistors is epitaxially grown between the transistors to create back-to-back P-N junctions in order to isolate the neighboring devices from each other. As a result, the fin region between neighboring devices is also doped with the opposite polarity as a result of the dopant diffusion during the epitaxial growth process, as well as a subsequent source/drain anneal process.

Figure 1:
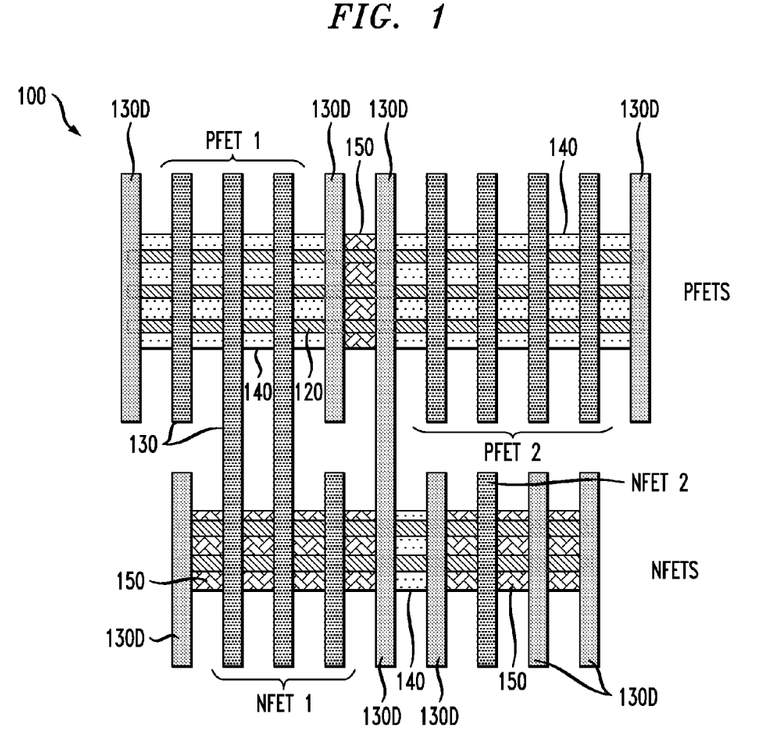
FIG. 1 is a top view of a set of FinFET devices, according to an exemplary embodiment of the present invention.

Referring to FIG. 1, which is a top view of a set of FinFET devices 100 in accordance with an embodiment of the present invention, in the case of two adjacent PFETs (PFET 1 and PFET2 at the top portion of FIG. 1), an n-type epitaxial region 150 forms an isolation region between the adjacent PFETs. The n-type epitaxial region 150 is epitaxially grown between dummy gates 130D of PFET1 and PFET2 instead of cutting the fins in that area. Conversely, in the case of two adjacent NFETs (NFET1 and NFET2 at the bottom portion of FIG. 1), a p-type epitaxial region 140 forms an isolation region between the adjacent NFETs. The p-type epitaxial region 140 is epitaxially grown between dummy gates 130D of NFET1 and NFET2 instead of cutting the fins in that area. As a result, cutting of the fins is avoided, and uniaxial strain on the fins in the areas between adjacent FETs is maintained.

As can be seen in FIG. 1, each transistor PFET 1, 2 and NFET 1, 2 has a dummy gate on respective left and right end sides thereof. As bracketed in FIG. 1, between their respective dummy gates, PFET1 has 3 active gates, PFET2 has 4 active gates, NFET1 has 3 active gates and NFET2 has 1 active gate. It is to be understood that the embodiments of the present invention are not limited to the number of FETs shown, and can include any number of FETs. In addition, the FETs can have any number of gates (also referred to as gate electrodes or gate lines) and are not limited to the number of gates illustrated.

While the embodiments of the present invention are largely applicable to maintain the benefits of compressive strain for PFETs by avoiding the loss of compressive strain caused by cutting of the fins, the embodiments of the present invention work equally well to create device isolation regions between adjacent NFETS without cutting of the fins. Accordingly, as described in the examples herein, the embodiments of the present invention are also used for NFETs when fabricating a given FinFET device. Alternatively, depending on design constraints, it is also contemplated to use the epitaxially grown device isolation regions of the embodiments of the present invention to avoid cutting of fins between adjacent PFETS, while also using conventional cutting of the fins between adjacent NFETs when fabricating a given FinFET device. Further, it is also contemplated that the embodiments of the invention can be applied to FinFET devices including only PFETs or only NFETs, or discriminately applied to devices having a particular type of doping.

Embodiments of the present invention also mitigate leakage increase by using dummy gates having a slightly longer channel length than the active gates of a device. For example, the channel length of the dummy gates can be up to about 5 nm longer than that of the active gates. The use of a slightly longer gate length further limits leakage through the device isolation region due to the reduction of short channel effects. Leakage is a metric by which the quality of an isolation can be assessed. For example, lower leakage indicates a better isolation.

It is to be understood that the various layers and/or regions shown in the accompanying drawings are not drawn to scale, and that one or more layers and/or regions of a type commonly used in FinFET devices may not be explicitly shown in a given drawing. This does not imply that the layers and/or regions not explicitly shown are omitted from the actual FinFET devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The FinFET devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the FinFET devices are contemplated embodiments of the invention. Given the teachings of embodiments of the invention provided herein, one of ordinary skill in the art will be able to contemplate other implementations and applications of embodiments of the invention.

Figure 2A:
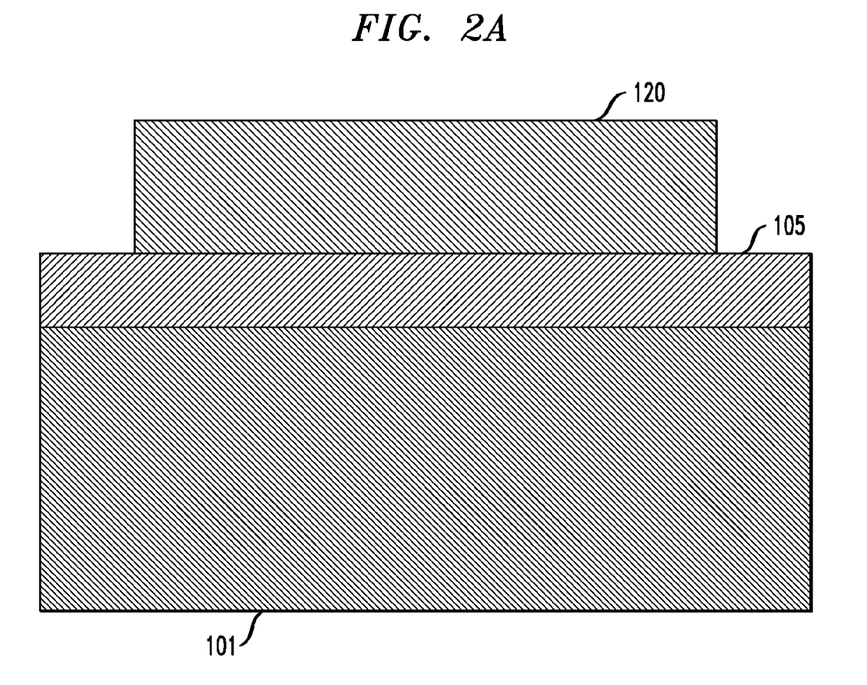
FIGS. 2A and 2B are cross-sectional and top views, respectively, illustrating fin formation in a method of manufacturing a semiconductor device including a plurality of FinFET devices, according to an embodiment of the present invention.
Figure 2B:
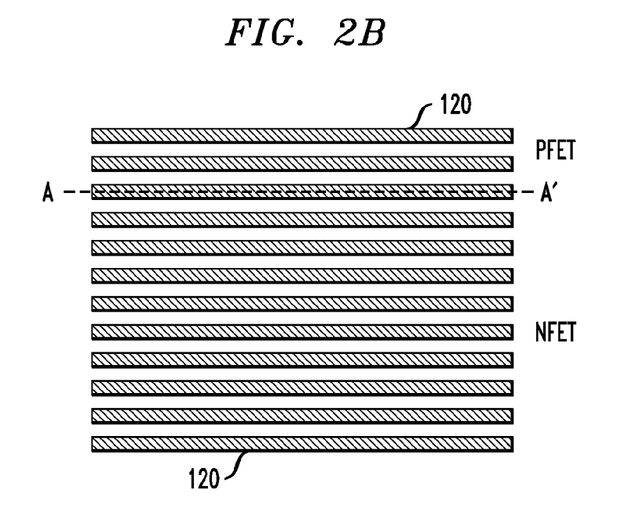

FIG. 2A is a cross-sectional view taken along a line A-A' parallel to an extension direction of a fin to illustrate a method of manufacturing a semiconductor device including a plurality of FinFET devices, according to an exemplary embodiment of the present invention. FIG. 2B is a top view of the fins in the FinFET device of FIG. 2A. For purposes of simplicity, the buried insulating layer 105 is not shown in the top view in FIG. 2B. Referring to FIGS. 2A and 2B, a semiconductor substrate 101, such as, for example, a silicon-on-insulator (SOI) substrate, includes a buried insulating layer 105, such as, for example, a buried oxide or nitride layer, located on an upper surface of the semiconductor substrate 101. The substrate 100 may comprise semiconductor material including, but not limited to, Si, SiGe, SiC, SiGeC or other like semiconductor. In addition, multiple layers of the semiconductor materials can be used as the semiconductor material of the substrate.

Fins 120 are formed on substrate 101 by patterning a silicon-on-insulator (SOI) layer (or a top portion of a bulk substrate if one is used) into the fins 120. The SOI layer may comprise semiconductor material including, but not limited to, Si, SiGe, SiC, SiGeC or other like semiconductor. In addition, multiple layers of the semiconductor materials can be used as the semiconductor material of the SOI layer. Patterning is performed by a method known in the art, for example, sidewall image transfer and etching. As shown in FIG. 2B, depending on the design and layout of the FinFET device, some fins 120 may be designated to correspond to PFET devices, while others may be designated to correspond to NFET devices.

Figure 3A:
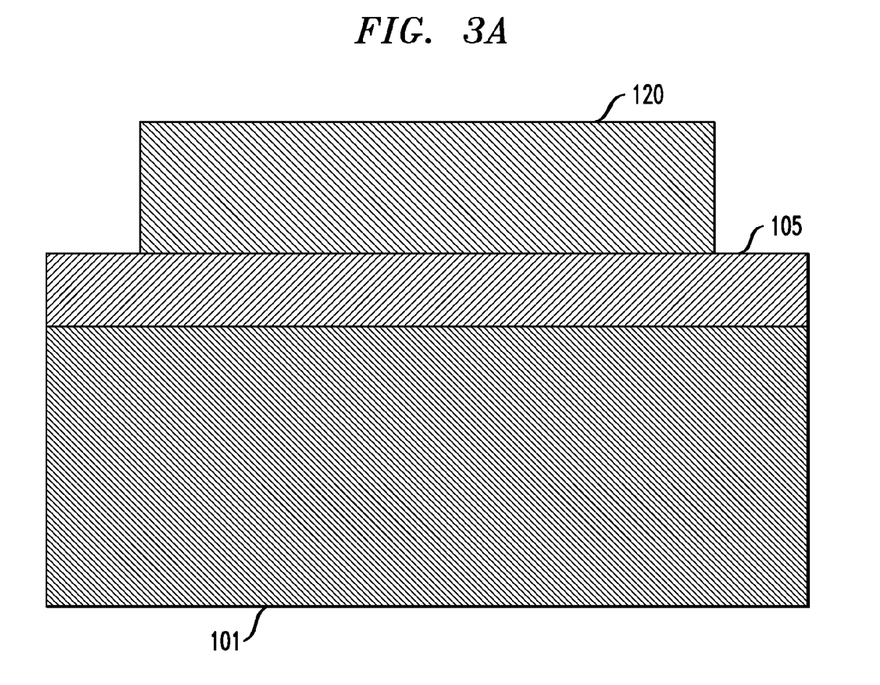
FIGS. 3A and 3B are cross-sectional and top views, respectively, illustrating removal of certain fins in a method of manufacturing a semiconductor device including a plurality of FinFET devices, according to an exemplary embodiment of the invention.
Figure 3B:
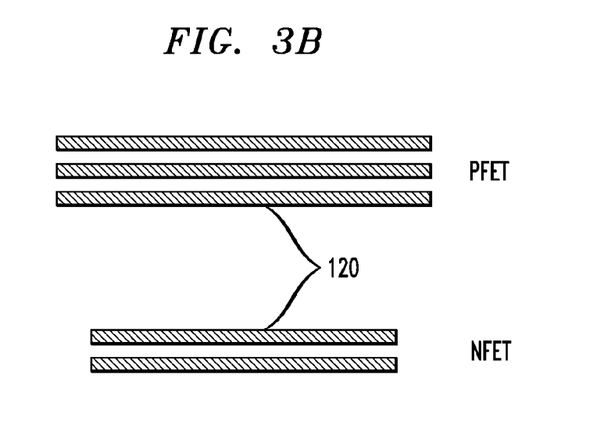

FIGS. 3A and 3B are cross-sectional and top views illustrating removal of certain fins in a method of manufacturing a semiconductor device including a plurality of FinFET devices, according to an exemplary embodiment of the invention. In accordance with an embodiment of the present invention, a fin cut mask is used to selectively remove fins between designated n and p regions where there may be no FETs according to a design, and no impact on stress. The selection of the fins for removal can be based on a design of the semiconductor device indicating where there are no FETs. Removal can be performed by, for example, lithographic patterning and etching. A selective semiconductor wet etch process, for example, can be used to remove the fins.

Figure 4A:
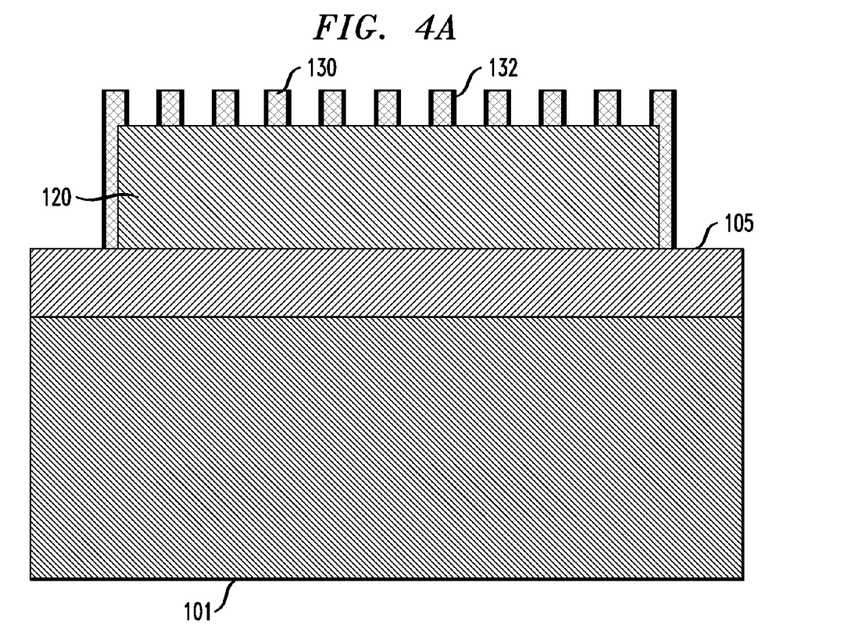
FIGS. 4A and 4B are cross-sectional and top views, respectively, illustrating gate and spacer formation in a method of manufacturing a semiconductor device including a plurality of FinFET devices, according to an exemplary embodiment of the invention.
Figure 4B:
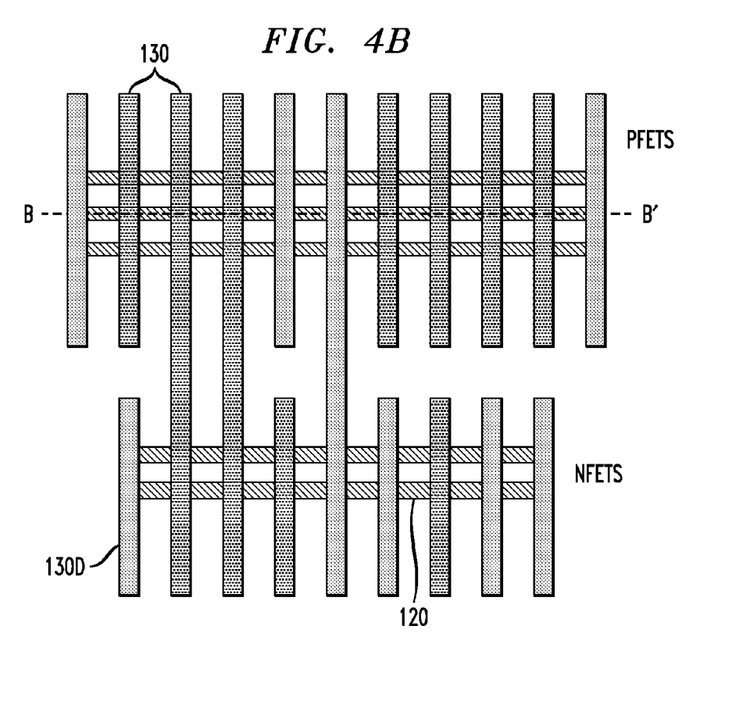

FIGS. 4A and 4B are cross-sectional and top views illustrating gate and spacer formation in a method of manufacturing a semiconductor device including a plurality of FinFET devices, according to an exemplary embodiment of the invention. FIG. 4A is a cross-sectional view taken along a line B-B' parallel to an extension direction of a fin. FIG. 4B is a top view of the fins and gates in the FinFET device of FIG. 4A. For purposes of simplicity, the spacers 132 and the buried insulating layer 105 are not shown in the top view in FIG. 4B. Referring to FIGS. 4A and 4B, gate electrodes 130 and spacers 132 can be formed by, for example, a replacement metal gate (RMG) process including dummy gate lithography and patterning, spacer formation, and replacement metal gate deposition. A cut-mask may be used to remove certain gate structures based on design constraints.

In an RMG process, sacrificial gate electrodes, made of, for example, an amorphous or polycrystalline silicon material, or other suitable materials, may be formed by any suitable deposition technique known in the art, including, but not limited to, chemical vapor deposition (CVD), physical vapor deposition (PVD), atomic layer deposition (ALD), molecular beam deposition (MBD), pulsed laser deposition (PLD), and/or liquid source misted chemical deposition (LSMCD). A sacrificial gate is removed by any suitable etching process capable of selectively removing the sacrificial gate without substantially removing material from the spacers 132 to form a gate cavity. The sacrificial gate may be removed by, for example, a reactive ion etching (RIE) process, which can selectively remove silicon to remove the sacrificial gate electrode, and, for example, a hydrofluoric acid-containing wet etch to remove a sacrificial gate dielectric layer.

A replacement metal gate electrode 130 may be formed using, for example, deposition techniques such as CVD, PVD, and ALD, sputtering, and/or plating. The replacement metal gate 130 may be formed on a dielectric layer including, for example, silicon oxide, hafnium oxide, zirconium oxide, aluminum oxide, titanium oxide, lanthanum oxide, strontium titanium oxide, lanthanum aluminum oxide, and mixtures thereof. The gate electrode 130 may include gate conductor materials including, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof. Referring to FIG. 4B, depending on a circuit layout, some gate electrodes 130 may be connected across PFET and NFET devices (note elongated gate electrodes 130 in FIG. 4B), while other gate electrodes 130 are connected across PFET or NFET devices. Referring to FIG. 1, some gate electrodes are dummy date electrodes 130D.

A spacer layer can be deposited and is patterned by, for example, an isotropic etching process, such as reactive ion etching (RIE), to form a spacer pattern 132 along sides of a sacrificial gate electrode, and eventually along sides of gate electrodes 130, once the sacrificial gate electrodes are removed and replaced by the gate electrodes 130. In accordance with embodiments of the present invention, NFET and PFET portions of the device can have the same or different spacer materials and the same or different spacer thicknesses. The spacers can be formed from, for example, oxides, nitrides or a combination thereof, such as, for example, silicon oxide, silicon nitride, silicon oxynitride, boron nitride, and/or silicon boron nitride.

Figure 5A:
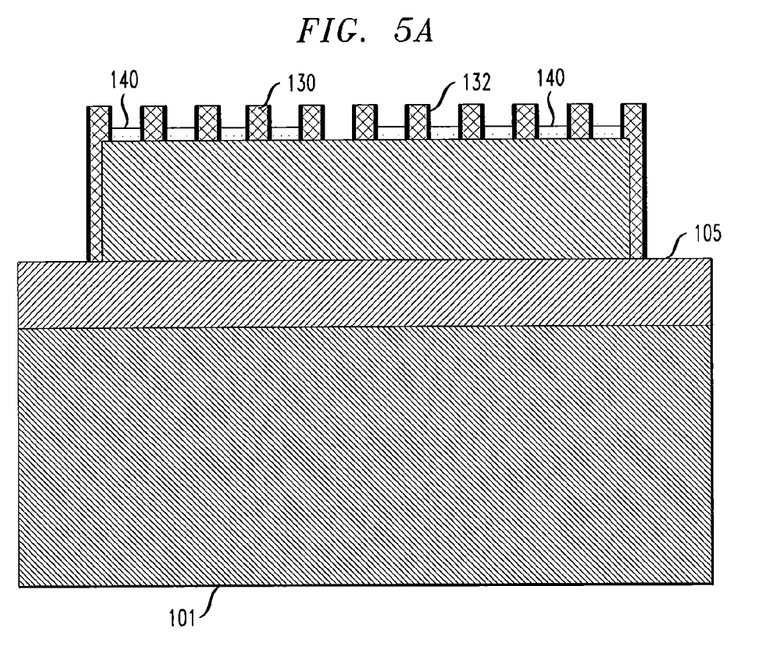
FIGS. 5A and 5B are cross-sectional and top views, respectively, illustrating growth of p-type epitaxial regions in a method of manufacturing a semiconductor device including a plurality of FinFET devices, according to an exemplary embodiment of the invention.
Figure 5B:
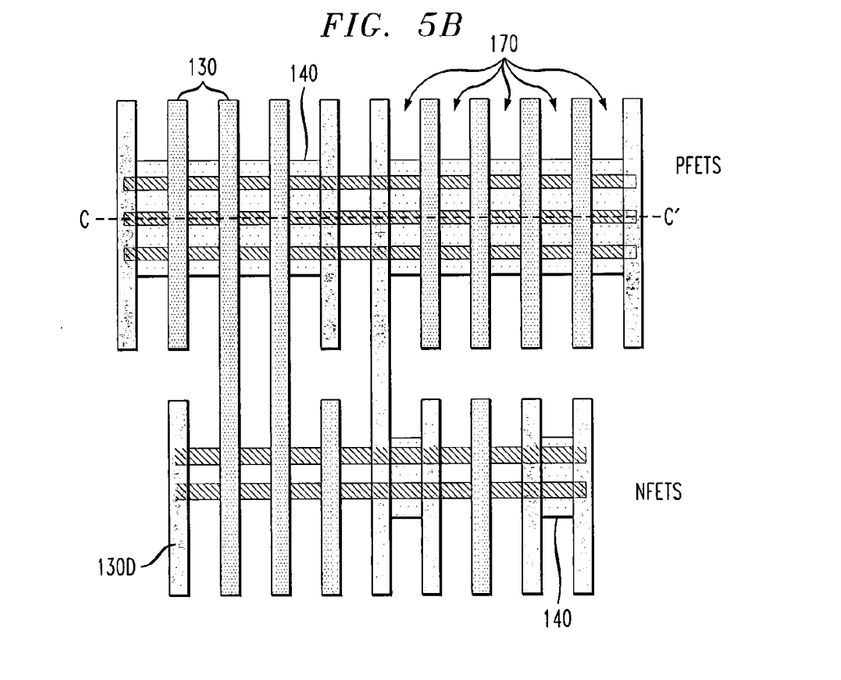

FIGS. 5A and 5B are cross-sectional and top views illustrating growth of p-type epitaxial regions in a method of manufacturing a semiconductor device including a plurality of FinFET devices, according to an exemplary embodiment of the invention. FIG. 5A is a cross-sectional view taken along a line C-C' parallel to an extension direction of a fin. FIG. 5B is a top view of the fins, gates and epitaxial regions in the FinFET device of FIG. 5A. For purposes of simplicity, the spacers 132 and the buried insulating layer 105 are not shown in the top view in FIG. 5B. Referring to FIGS. 5A and 5B, in-situ p-type doped epitaxy 140 is grown between certain PFET gate electrodes 130 and certain NFET gate electrodes 130. The dopant introduced during epitaxial growth can include, for example, in-situ boron doped silicon, with a doping concentration ranging from, for example, $10^{19}$ to $10^{22}$ cm$^{-3}$. It is to be understood that the embodiments of the present invention are not necessarily limited to the aforementioned dopant and doses.

The positioning of the p-type doped epitaxy 140 is controlled using, for example, block mask patterning and lithography techniques. In this process, a dielectric is deposited onto the wafer, and then the wafer is coated with a photoresist. A photomask is then aligned to the wafer, wherein a mask contains the shapes which denote the locations of the desired epitaxy to be performed. Then, the wafer is exposed to ultraviolet light, the photoresist is developed, and the exposed photoresist is removed, leaving only photoresist on the wafer in certain locations. After the underlying dielectric is etched, the selective epitaxy is performed. According to an embodiment, the positioning is controlled so that the epitaxy region 140 grows at source/drain regions 170 of a PFET, between adjacent NFETs, but not between adjacent PFETs. Growth of the epitaxy region 140 at source/drain regions 170 of one or more PFETs, and between one or more adjacent NFETs can occur in a single step. Referring to FIGS. 5A and 5B, the growth of the p-type epitaxial region 140 is prevented at the area between adjacent PFETs, where fins were cut in conventional processing to electrically isolate the source/drain regions of the adjacent PFETs from each other. The growth of the p-type epitaxial region 140 occurs between adjacent NFETs, where fins were cut in conventional processing. After the epitaxial growth, a high temperature annealing step, such as rapid thermal annealing, may be performed to drive in the dopants. The dopants in the PFET source/drain regions diffuse into the fin and underneath the spacer region to form a source/drain extension region. The dopants in the NFET isolation regions diffuse into the fin and underneath the spacer region of the dummy gates to form a p-type region. In the case of the adjacent NFETs, as further described with reference to FIGS. 6A and 6B, the p-type epitaxial region 140 will act as an isolation region to electrically isolate the source/drain regions of the adjacent NFETs from each other.

Figure 6A:
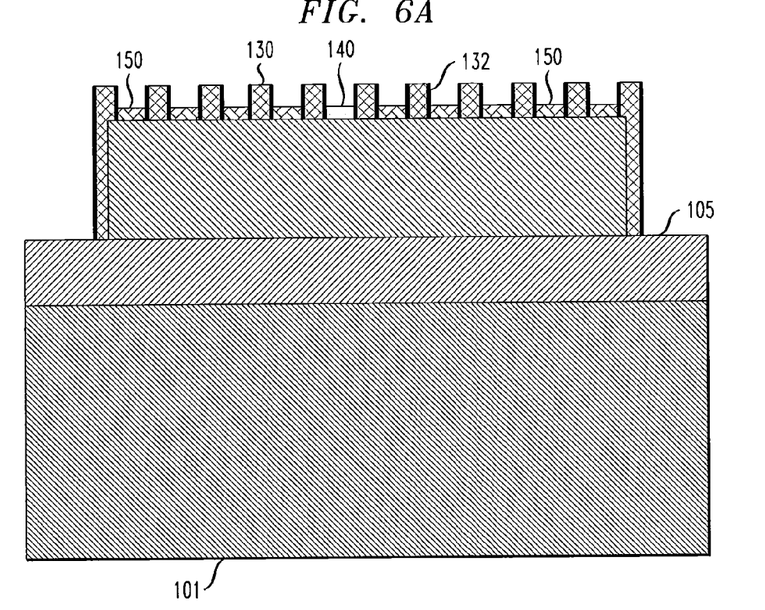
FIGS. 6A and 6B are cross-sectional and top views, respectively, illustrating growth of n-type epitaxial regions in a method of manufacturing a semiconductor device including a plurality of FinFET devices, according to an exemplary embodiment of the invention.
Figure 6B:
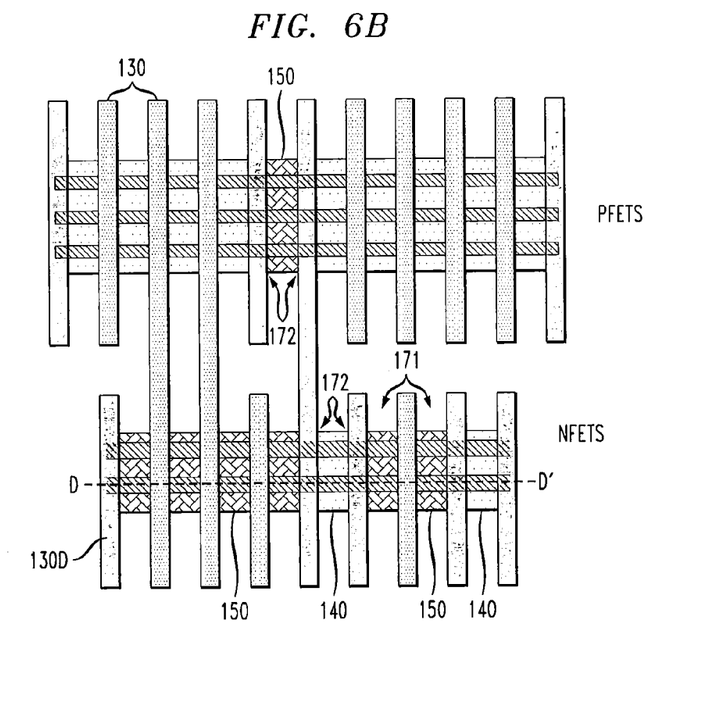

FIGS. 6A and 6B are cross-sectional and top views illustrating growth of n-type epitaxial regions in a method of manufacturing a semiconductor device including a plurality of FinFET devices, according to an exemplary embodiment of the invention. FIG. 6A is a cross-sectional view taken along a line D-D' parallel to an extension direction of a fin. FIG. 6B is a top view of the fins, gates and epitaxial regions in the FinFET device of FIG. 6A. For purposes of simplicity, the spacers 132 and the buried insulating layer 105 are not shown in the top view in FIG. 6B. Referring to FIGS. 6A and 6B, in-situ n-type doped epitaxy 150 is grown between certain NFET gate electrodes 130 and certain PFET gate electrodes 130. The dopant introduced during epitaxial growth can include, for example, in-situ phosphorous-doped silicon, at doses of, for example, ranging anywhere between $10^{19}$ and $10^{22}$ cm$^{-3}$. It is to be understood that the embodiments of the present invention are not necessarily limited to the aforementioned dopant and doses.

The positioning of the n-type doped epitaxy 150 is controlled using, for example, block mask patterning and lithography techniques as described above. According to an embodiment, the positioning is controlled so that the epitaxy region 150 grows at source/drain regions 171 of an NFET, between adjacent PFETs, but not between adjacent NFETs. Growth of the epitaxy region 150 at source/drain regions 171 of one or more NFETs, and between one or more adjacent PFETs can occur in a single step. Referring to FIGS. 6A and 6B, the growth of the n-type epitaxial region 150 is prevented at the area between adjacent NFETs, which includes the p-type epitaxial region 140 to electrically isolate the source/drain regions of the adjacent NFETs from each other. The growth of the n-type epitaxial region 150 occurs between adjacent PFETs, where fins were cut in conventional processing, so that the n-type epitaxial region 150 acts as an isolation region to electrically isolate the source/drain regions of the adjacent PFETs from each other. After the epitaxial growth, a high temperature annealing step, such as rapid thermal annealing, may be performed to drive in the dopants. The dopants in the NFET source/drain regions diffuse into the fin and underneath the spacer region to form the source/drain extension region. The dopants in the PFET isolation regions diffuse into the fin and underneath the spacer region of the dummy gate to form an n-type region.

As a result, the p-type and n-type epitaxial regions 140 and 150, respectively positioned between adjacent NFETs and adjacent PFETs provide back-to-back P-N junctions 172 so as to function as isolation regions between transistors having the same polarity. Accordingly, the p-type and n-type epitaxial regions 140 and 150 positioned according to the embodiments of the present invention provide an alternative to cutting fins, and allow for preservation of uniaxial strain, and, consequently, improved device performance.

Figure 7A:
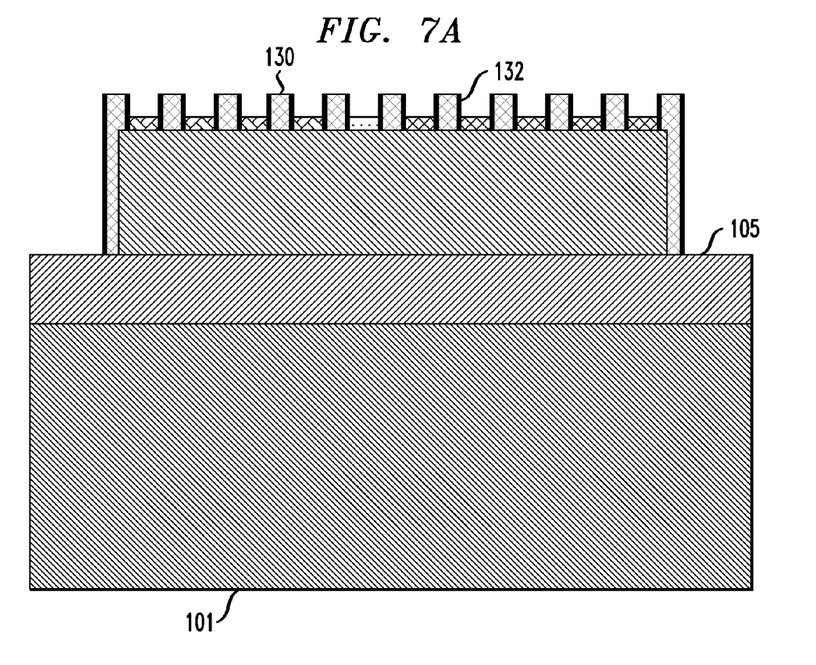
FIGS. 7A and 7B are cross-sectional and top views, respectively, illustrating placement of contacts in a method of manufacturing a semiconductor device including a plurality of FinFET devices, according to an exemplary embodiment of the invention.
Figure 7B:
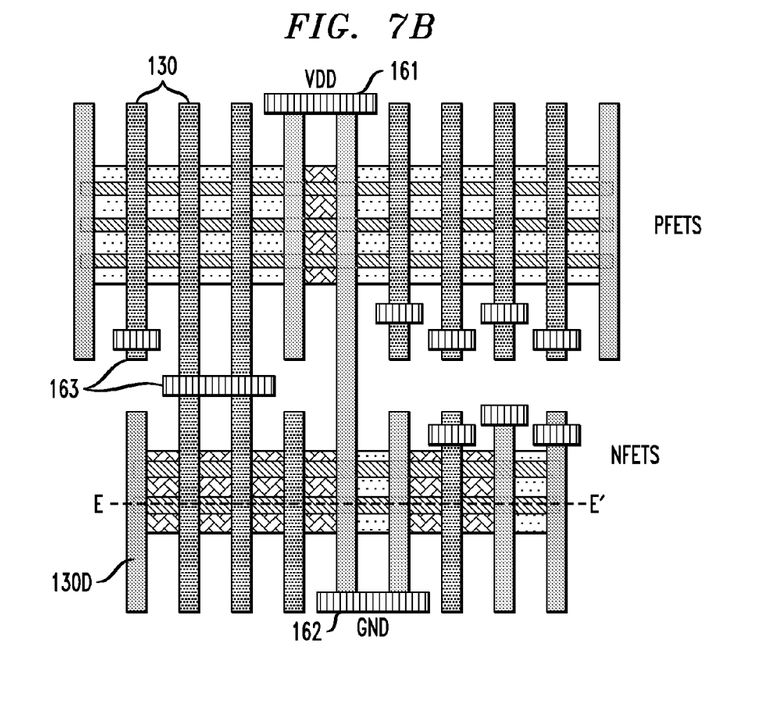

FIGS. 7A and 7B are cross-sectional and top views illustrating placement of contacts in a method of manufacturing a semiconductor device including a plurality of FinFET devices, according to an exemplary embodiment of the invention. FIG. 7A is a cross-sectional view taken along a line E-E' parallel to an extension direction of a fin. FIG. 7B is a top view of the fins, gates, epitaxial regions and contacts in the FinFET device of FIG. 7A. For purposes of simplicity, the spacers 132 and the buried insulating layer 105 are not shown in the top view in FIG. 7B. Referring to FIGS. 7A and 7B, the dummy gate electrodes 130D corresponding to the isolation region 150 on the PFET side are connected to a positive supply voltage (e.g., VDD, VCC) through contact 161, while the dummy gate electrodes 130D corresponding to the isolation region 140 on the NFET side are connected to a negative supply voltage (e.g., ground (GND), VSS) through contact 162. Such connections respectively to positive and negative supply voltages provide isolation between PFET and NFET devices. Other positive and negative supply voltages can be used.

Contacts 163 on or connected to various gate electrodes 130 are further illustrated in FIG. 7B. The positioning of the contacts 163 is predetermined based on design constraints for the layout of the FinFET devices. The contacts 161, 162 and 163 can include, for example, contact bars or contact holes.

Figure 8:
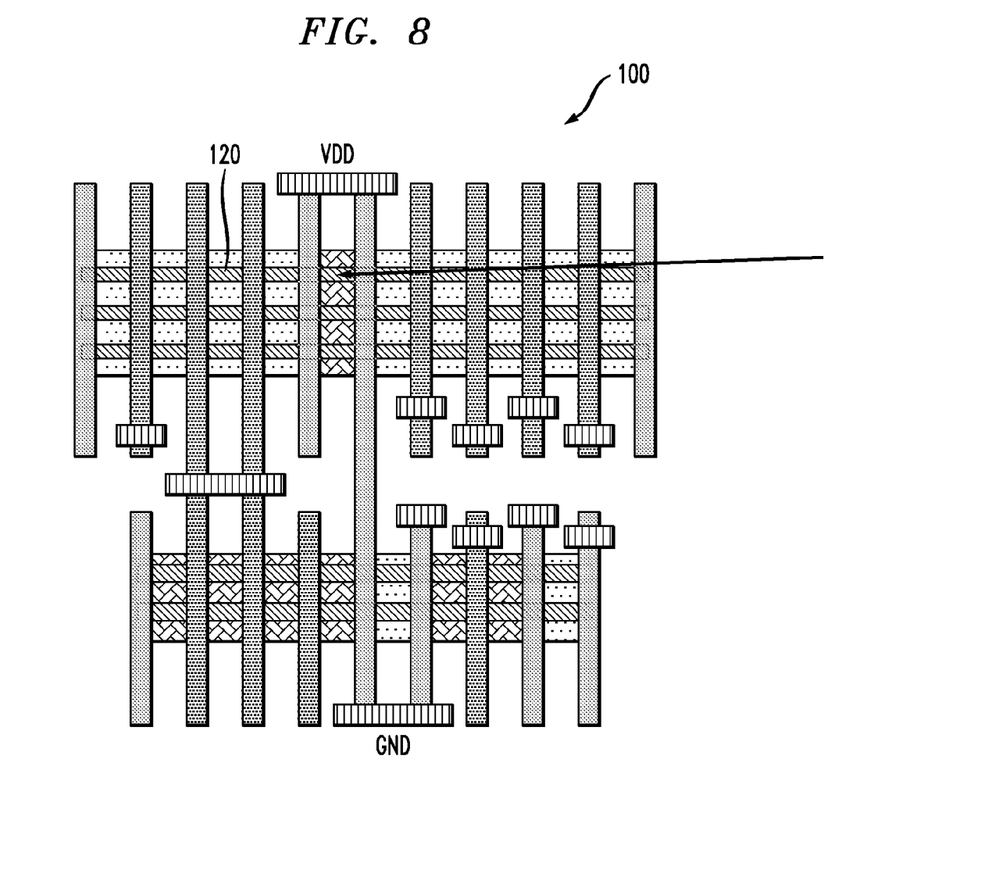
FIG. 8 is a top view of a set of FinFET devices, according to an exemplary embodiment of the present invention.

FIG. 8 is a top view of a FinFET device 100, in accordance with an embodiment of the present invention, showing, by the arrow, where, in a conventional scheme, 3 upper fins 120 would be cut, and, therefore relax, the compressive strain near the fin edges, negatively affecting device performance in the case of a PFET.

Figure 9:
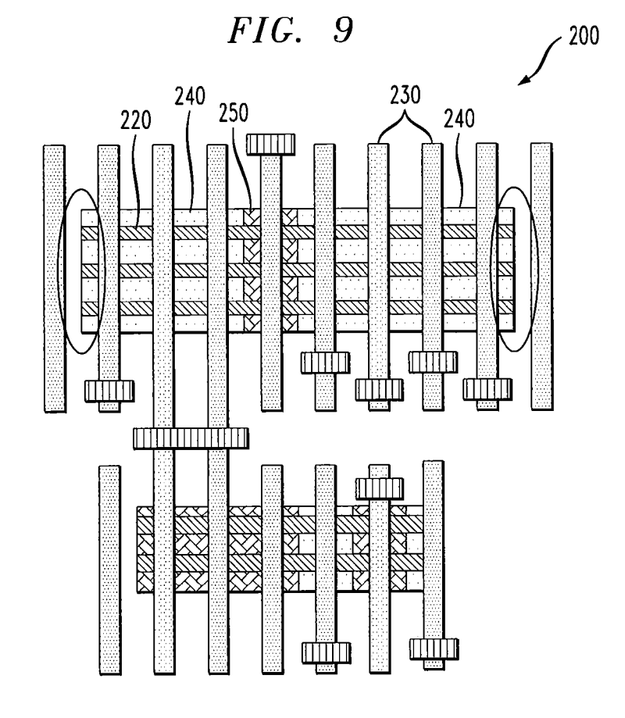
FIG. 9 is a top view of a set of FinFET devices, according to another exemplary embodiment of the present invention.

FIG. 9 is a top view of a FinFET device 200, in accordance with an embodiment of the present invention. Referring to FIG. 9, unlike the fins 120 of the FinFET device 100, which end a part of the way (e.g., halfway) overlapping a gate electrode 130, the fins 220 in the FinFET device 200 end part of the way (e.g., halfway) between two gate electrodes 230 (as shown in the circled areas). Accordingly, the FinFET device 200 requires a different mask for locating p-type and n-type epitaxy regions 240 and 250 than the mask for locating p-type and n-type epitaxy regions 140 and 150 used in connection with the FinFET device 100.

Figure 10:
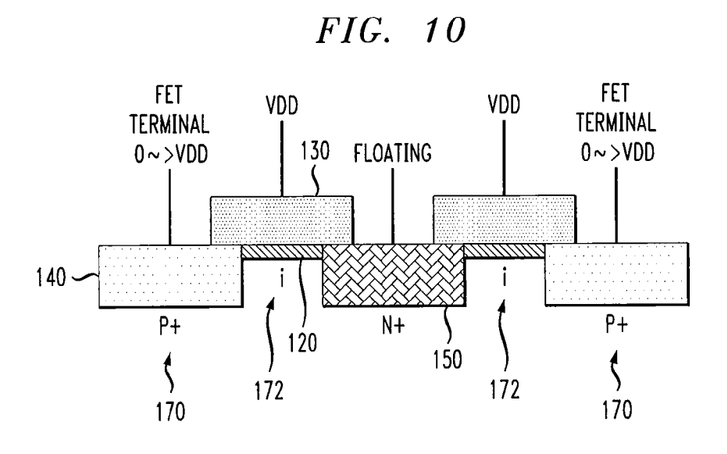
FIG. 10 is a schematic diagram to illustrate the electrical characteristics of FinFET devices, according to an exemplary embodiment of the invention.

FIG. 10 is a schematic diagram to illustrate the electrical characteristics of the fins 120, the electrodes 130, and the p-type and n-type epitaxy regions 140 and 150 in a PFET dummy area of a FinFET device. Referring to FIG. 10, examples of the drain terminal voltages for two adjacent PFET devices, two dummy gates, and the adjoining isolation region are shown. Based on these voltages and the doping in each of the regions, one can conclude that the two PFET devices are electrically isolated from one another. Referring to, for example, FIGS. 1, 5B, 6B, 7B and 8, there is no source/drain epitaxy under a gate region. However, as can be seen in FIG. 10, due to dopant diffusion, the epitaxial regions 140, 150 may encroach slightly under the gate.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device including a plurality of fin field-effect transistor (FinFET) devices, the method comprising:
    forming a plurality of fins on a substrate, wherein a first portion of the fins corresponds to p-type field-effect transistors, and a second portion of the fins corresponds to n-type field-effect transistors;
    forming a plurality of gate electrodes on the plurality of the fins;
    growing a p-type doped epitaxial region at each of a plurality of source/drain regions between predetermined gate electrodes of the p-type field-effect transistors; and
    growing an n-type doped epitaxial region at one or more areas between gate electrodes of respective adjacent p-type field-effect transistors to create one or more p-n junctions electrically isolating the adjacent p-type field-effect transistors from each other.

2. The method of claim 1, wherein locations of the p-type and n-type doped epitaxial regions are lithographically controlled.

3. The method of claim 1, further comprising:
    growing an n-type doped epitaxial region at each of a plurality of source/drain regions between predetermined gate electrodes of the n-type field-effect transistors; and
    growing a p-type doped epitaxial region at one or more areas between gate electrodes of respective adjacent n-type field-effect transistors to create one or more p-n junctions electrically isolating the adjacent n-type field-effect transistors from each other.

4. The method of claim 3, wherein the growing of an n-type doped epitaxial region between gate electrodes of respective adjacent p-type field-effect transistors, and the growing of an n-type doped epitaxial region at each of a plurality of source/drain regions between predetermined gate electrodes of the n-type field-effect transistors, are performed in the same step.

5. The method of claim 3, wherein the growing of a p-type doped epitaxial region between gate electrodes of respective adjacent n-type field-effect transistors, and the growing of a p-type doped epitaxial region at each of a plurality of source/drain regions between predetermined gate electrodes of the p-type field-effect transistors, are performed in the same step.

6. The method of claim 3, further comprising:
connecting the gate electrodes of the respective adjacent p-type field-effect transistors to a positive supply voltage; and
connecting the gate electrodes of the respective adjacent n-type field-effect transistors to a negative supply voltage.

7. The method of claim 1, further comprising selectively removing one or more of the fins.

8. The method of claim 1, further comprising preventing growth of a p-type doped epitaxial region at the one or more areas between gate electrodes of respective adjacent p-type field-effect transistors.

9. The method of claim 3, further comprising preventing growth of an n-type doped epitaxial region at the one or more areas between gate electrodes of respective adjacent n-type field-effect transistors.

10. The method of claim 1, wherein one or more of the gate electrodes are connected across fins corresponding to both p-type field-effect transistors and n-type field-effect transistors.

11. A method for manufacturing a semiconductor device including a plurality of fin field-effect transistor (FinFET) devices, the method comprising:
forming a plurality of fins on a substrate, wherein at least a portion of the fins corresponds to first field-effect transistors having a first type of doping;
forming a plurality of gate electrodes on the plurality of the fins;
growing an epitaxial region having the first type of doping at each of a plurality of source/drain regions between predetermined gate electrodes of the first field-effect transistors; and
growing an epitaxial region having a second type of doping at one or more areas between gate electrodes of respective adjacent first field-effect transistors to create one or more junctions electrically isolating the adjacent first field-effect transistors from each other.

12. The method of claim 11, wherein locations of epitaxial regions having the first and second types of doping are lithographically controlled.

13. The method of claim 11, wherein at least another portion of the fins corresponds to second field-effect transistors having the second type of doping, the method further comprising:

growing an epitaxial region having the second type of doping at each of a plurality of source/drain regions between predetermined gate electrodes of the second field-effect transistors; and
growing an epitaxial region having the first type of doping at one or more areas between gate electrodes of respective adjacent second field-effect transistors to create one or more junctions electrically isolating the adjacent second field-effect transistors from each other.

14. The method of claim 13, wherein the growing of an epitaxial region having the second type of doping between gate electrodes of respective adjacent first field-effect transistors, and the growing of an epitaxial region having the second type of doping at each of a plurality of source/drain regions between predetermined gate electrodes of the second field-effect transistors, are performed in the same step.

15. The method of claim 13, wherein the growing of an epitaxial region having the first type of doping between gate electrodes of respective adjacent second field-effect transistors, and the growing of an epitaxial region having the first type of doping at each of a plurality of source/drain regions between predetermined gate electrodes of the first field-effect transistors, are performed in the same step.

16. The method of claim 13, further comprising:
connecting the gate electrodes of the respective adjacent first field-effect transistors to a positive supply voltage; and
connecting the gate electrodes of the respective adjacent second field-effect transistors to a negative supply voltage.

17. The method of claim 11, further comprising selectively removing one or more of the fins.

18. The method of claim 11, further comprising preventing growth of an epitaxial region having the first type of doping at the one or more areas between gate electrodes of respective adjacent first field-effect transistors.

19. The method of claim 13, further comprising preventing growth of an epitaxial region having the second type of doping at the one or more areas between gate electrodes of respective adjacent second field-effect transistors.

20. A fin field-effect transistor (FinFET) device, comprising:
a plurality of fins on a substrate, wherein a first portion of the fins corresponds to p-type field-effect transistors, and a second portion of the fins corresponds to n-type field-effect transistors;
a plurality of gate electrodes on the plurality of the fins;
a p-type doped epitaxial region at each of a plurality of source/drain regions between gate electrodes of the p-type field-effect transistors; and
an n-type doped epitaxial region at one or more areas between gate electrodes of respective adjacent p-type field-effect transistors creating one or more p-n junctions electrically isolating the adjacent p-type field-effect transistors from each other.

* * * * *